(12) United States Patent
Park et al.

(10) Patent No.: US 10,285,271 B2
(45) Date of Patent: May 7, 2019

(54) MULTILAYER CERAMIC ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 66 days.

(21) Appl. No.: 15/217,388

(22) Filed: Jul. 22, 2016

(65) Prior Publication Data

US 2017/0164479 A1 Jun. 8, 2017

(30) Foreign Application Priority Data

Dec. 8, 2015 (KR) .................. 10-2015-0174215

(51) Int. Cl.
*H05K 1/18* (2006.01)
*H01G 4/005* (2006.01)
(Continued)

(52) U.S. Cl.
CPC .......... *H05K 1/181* (2013.01); *H01G 4/005* (2013.01); *H01G 4/12* (2013.01); *H01G 4/248* (2013.01);
(Continued)

(58) Field of Classification Search
CPC ................................. H05K 1/181
(Continued)

(56) References Cited

U.S. PATENT DOCUMENTS

2008/0239621 A1* 10/2008 Tajuddin .................. H01G 2/06
361/306.1
2010/0188798 A1* 7/2010 Togashi .................. H01G 2/06
361/306.3
(Continued)

FOREIGN PATENT DOCUMENTS

JP 11-307387 A 11/1999
JP 2000-223375 A 8/2000
(Continued)

OTHER PUBLICATIONS

Korean Office Action issued in Korean Application No. 10-2015-0174215, dated Oct. 14, 2016, with English Translation.

*Primary Examiner* — Stanley Tso
(74) *Attorney, Agent, or Firm* — Morgan Lewis & Bockius LLP

(57) ABSTRACT

A multilayer ceramic electronic component includes a multilayer ceramic capacitor, first and second metal frames, and an insulating cover. The multilayer ceramic capacitor includes a ceramic body having a plurality of dielectric layers stacked together and first and second internal electrodes alternately disposed between pairs of adjacent dielectric layers, and external electrodes disposed on two end surfaces of the ceramic body opposite each other in a length direction orthogonal to the stacking direction. The first and second metal frames are each disposed along a respective one of two end surfaces of the multilayer ceramic capacitor opposite each other in the length direction, and are each disposed along upper and lower surfaces of the multilayer ceramic capacitor. The insulating cover is disposed to enclose the multilayer ceramic capacitor and upper surfaces of the first and second metal frames. A board can have the multilayer ceramic electronic component mounted thereon.

19 Claims, 11 Drawing Sheets

(51) Int. Cl.
*H01G 4/248* (2006.01)
*H01G 4/12* (2006.01)
*H01G 4/30* (2006.01)
*H05K 1/11* (2006.01)

(52) U.S. Cl.
CPC .............. *H01G 4/30* (2013.01); *H05K 1/111* (2013.01); *H05K 2201/10015* (2013.01)

(58) Field of Classification Search
USPC ........................................................ 174/260
See application file for complete search history.

(56) References Cited

U.S. PATENT DOCUMENTS

| | | | | |
|---|---|---|---|---|
| 2014/0116763 A1* | 5/2014 | Sato | ........................ | H05K 1/186 |
| | | | | 174/258 |
| 2014/0116767 A1* | 5/2014 | Sato | ........................ | H05K 1/185 |
| | | | | 174/260 |
| 2015/0014038 A1* | 1/2015 | Park | ........................ | H01G 2/065 |
| | | | | 174/260 |
| 2015/0083475 A1* | 3/2015 | Kim | ........................ | H01G 4/232 |
| | | | | 174/260 |
| 2017/0103852 A1* | 4/2017 | Ando | ..................... | H01G 4/002 |

FOREIGN PATENT DOCUMENTS

| | | |
|---|---|---|
| JP | 2000-228327 A | 8/2000 |
| JP | 2003-224028 A | 8/2003 |
| JP | 2004-266110 A | 9/2004 |
| KR | 2015-0006623 A | 1/2015 |

\* cited by examiner

MULTILAYER CERAMIC ELECTRONIC COMPONENT AND BOARD HAVING THE SAME

CROSS-REFERENCE TO RELATED APPLICATION

This application claims the benefit of Korean Patent Application No. 10-2015-0174215 filed on Dec. 8, 2015, with the Korean Intellectual Property Office, the disclosure of which is incorporated herein by reference.

BACKGROUND

The present disclosure relates to a multilayer ceramic electronic component and a board having the same.

Multilayer ceramic capacitors (MLCCs), types of multilayer electronic component, are commonly used in electronic apparatuses because of their inherent advantages such as a small size, high capacitance, and ease of mounting.

Meanwhile, with the electrification of vehicles, electronic control of such vehicles has become popular. As a result, the number of electrical control units (ECUs) mounted in such vehicles has increased. Further, operation control systems have increased in complexity due to the need for communications and networking between the ECUs. Finally, each ECU that is directly associated with the safety performance of a vehicle requires strict reliability and durability.

Such ECUs are used in environments in which temperatures are high, sudden changes in temperature can occur, and the ECUs may be exposed to mechanical stresses such as vibrations and shocks for an extended period of time.

Such ECUs may each contain one or more multilayer ceramic capacitors having thermal or electrical reliability characteristics.

The multilayer ceramic capacitors may each include a stack of a plurality of dielectric layers, as well as internal electrodes disposed between the dielectric layers and having different alternating polarities through the stack.

Here, since the dielectric layers each have a piezoelectric property, when a direct current (DC) or alternating current (AC) voltage is applied to the multilayer ceramic capacitor, a piezoelectric phenomenon may occur between the internal electrodes, generating periodic vibrations while expanding and contracting a volume of a ceramic body depending on a frequency of a voltage applied thereto.

The vibrations may be transferred to a board through external electrodes of the multilayer ceramic capacitor and solders connecting the external electrodes and the board to each other, such that the entirety of the board may act as a sound reflecting surface to generate vibration sound, experienced by users as noise.

The vibration sound may correspond to an audio frequency within a range of 20 to 20,000 Hz, causing listener discomfort. The vibration sound causing listener discomfort, as described above, is known as acoustic noise.

There may be a problem in that quality of devices may deteriorate due to acoustic noise.

Meanwhile, as causes of defects in multilayer ceramic capacitors, there may be cracks, or the like, due to the mechanical stress resulting from the vibrations described above. As a result, external moisture may permeate into the multilayer ceramic capacitor, and thus a level of insulating resistance may be reduced and the ECU may fail or otherwise stop operating.

Therefore, a need exists for improving the reliability of multilayer ceramic capacitors used in ECUs.

SUMMARY

An aspect of the present disclosure may provide a multilayer ceramic electronic component and a board having the same capable of reducing acoustic noise and improving reliability of an electronic component.

According to an aspect of the present disclosure, a multilayer ceramic electronic component may include a multilayer ceramic capacitor, first and second metal frames, and an insulating cover. The multilayer ceramic capacitor includes a ceramic body having a plurality of dielectric layers stacked together and first and second internal electrodes alternately disposed between pairs of adjacent dielectric layers of the plurality of stacked dielectric layers, and external electrodes disposed on two end surfaces of the ceramic body opposite each other in a length direction orthogonal to a stacking direction of the dielectric layers. The first and second metal frames are each disposed along a respective one of two end surfaces of the multilayer ceramic capacitor opposite each other in the length direction, and are each disposed along upper and lower surfaces of the multilayer ceramic capacitor. The insulating cover is disposed to enclose the multilayer ceramic capacitor and upper surfaces of the first and second metal frames.

According to another aspect of the present disclosure, a board assembly having a multilayer ceramic electronic component may include a board having first and second electrode pads mounted thereon, and the multilayer ceramic electronic component mounted on the first and second electrode pads. The first and second metal frames are respectively connected to the first and second electrode pads.

According to another aspect of the present disclosure, a multilayer ceramic electronic component includes a multilayer ceramic capacitor and first and second metal frames. The multilayer ceramic capacitor has a hexahedral shape, and has a pair of external electrodes spaced apart from each other on an upper surface of the multilayer ceramic capacitor. The first and second metal frames each include an upper portion, a lower portion, and a connection portion, and are each such that the upper portion is disposed along the upper surface of the multilayer ceramic capacitor, the lower portion is disposed along a lower surface of the multilayer ceramic capacitor, and the connection portion extends between the upper and lower portions along a respective end surface of the multilayer ceramic capacitor. The upper portion of each of the first and second metal frames is electrically connected to a respective external electrode of the multilayer ceramic capacitor.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
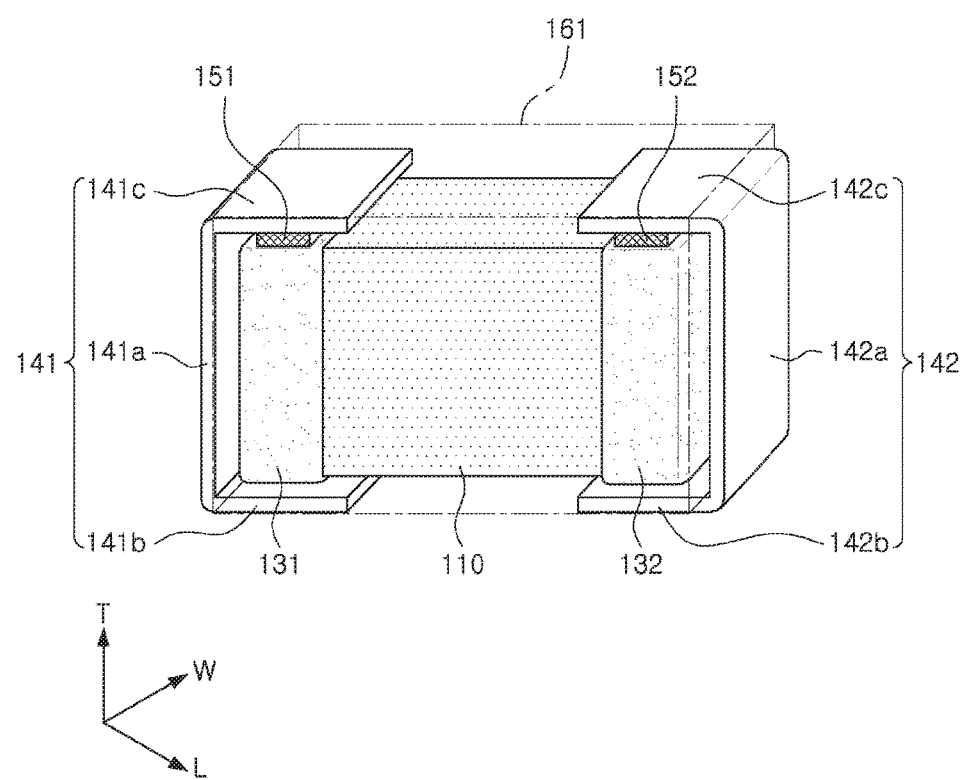
FIG. 1 is a perspective view schematically illustrating a multilayer ceramic electronic component according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region, or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of the exemplary embodiments.

Spatially relative terms, such as "above," "upper," "below," "lower," and the like, may be used herein for ease of description to describe one element's positional relationship relative to one or more other elements as shown in the figures. It will be understood that the spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements or features. Thus, the term "above" can encompass both the above and below orientations depending on a particular direction of the devices, elements, or figures. The device may be otherwise oriented (rotated 90 degrees or at other orientations) and the spatially relative descriptors used herein may be interpreted accordingly.

The terminology used herein is for describing particular illustrative embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, members, elements, and/or groups, but do not preclude the presence or addition of one or more other features, integers, steps, operations, members, elements, and/or groups.

Hereinafter, embodiments of the present disclosure will be described with reference to schematic views illustrating embodiments. In the drawings, components having ideal shapes are shown. However, variations from these ideal shapes, for example due to variability in manufacturing techniques and/or tolerances, also fall within the scope of the disclosure. Thus, embodiments of the present disclosure should not be construed as being limited to the particular shapes of regions shown herein, but should more generally be understood to include changes in shape resulting from manufacturing methods and processes. The following embodiments may also be constituted by one or a combination thereof.

The present disclosure describes a variety of configurations, and only illustrative configurations are shown herein. However, the disclosure is not limited to the particular illustrative configurations presented herein, but extends to other similar/analogous configurations as well.

Hereinafter, a multilayer ceramic electronic component according to the present disclosure will be described.

FIG. 1 is a perspective view schematically illustrating a multilayer ceramic electronic component according to an exemplary embodiment.

Referring to FIG. 1, a multilayer ceramic electronic component according to an exemplary embodiment may include a multilayer ceramic capacitor including a ceramic body 110 and first and second external electrodes 131 and 132, first and second metal frames 141 and 142, and an insulating cover 161 disposed to enclose the multilayer ceramic capacitor and upper surfaces of the first and second metal frames 141 and 142. Note that the insulating cover 161 is illustratively shown as being transparent in FIG. 1 in order not to obscure structures disposed therein for purposes of illustration, but that the insulating cover 161 may more generally be formed of a translucent or opaque material.

According to the present exemplary embodiment, the ceramic body 110 may be formed by stacking a plurality of dielectric layers 111 (see, e.g., FIG. 5) in a thickness direction and then sintering the plurality of dielectric layers 111.

Here, the respective adjacent dielectric layers 111 of the ceramic body 110 may be integrated with each other so that boundaries therebetween may not be readily confirmed without the use of a scanning electron microscope.

In addition, the ceramic body 110 may have a hexahedral shape. However, a shape of the ceramic body 110 is not limited thereto.

Directions of a hexahedron of the ceramic body 110 will be defined in order to more clearly describe exemplary embodiments in the present disclosure. L, W, and T directions depicted in FIG. 1 refer to a length direction, a width direction, and a thickness direction, respectively. In this case, a lower surface is defined as a mounting surface and an upper surface is defined as opposing the mounting surface (e.g., opposing the mounting surface in the thickness direction).

Further, cover layers having a predetermined thickness may be disposed above an upper surface of an internal electrode positioned uppermost in the ceramic body 110 and below a lower surface of an internal electrode positioned lowermost in the ceramic body 110, respectively, if necessary.

Here, the cover layer may be formed of the same composition as that of the dielectric layers 111 and be formed by stacking one or more dielectric layers that do not include internal electrodes on upper and lower surfaces of the ceramic body 110, respectively.

According to the present exemplary embodiment, the first and second metal frames 141 and 142 may have an approximately 'E' shape each extending over three surfaces of the hexahedral ceramic body 110.

The first and second metal frames 141 and 142 may include first and second terminal parts 141b and 142b disposed on amounting surface of the ceramic body 110 and serving as a terminal for mounting on the board. The first and second metal frames 141 and 142 may further include first and second horizontal parts 141c and 142c disposed to face the upper surface of the ceramic body 110, and to be disposed opposite the first and second terminal parts 141b and 142b upwardly and downwardly so as to have the ceramic body 110 disposed between the parts 141b and 141c and between the parts 142b and 142c. The first and second horizontal parts 141c and 142c are connected to the external electrodes 131 and 132, respectively, on the upper surface of the ceramic body 110. The first and second metal frames 141 and 142 may additionally include first and second vertical parts 141a and 142a connecting the first and second horizontal parts 141c and 142c to the first and second terminal parts 141b and 142b, respectively.

In addition, the first and second terminal parts 141b and 142b may be subjected to surface treatment such as nickel/tin plating and/or nickel/gold plating, if necessary, so that a contact feature with solders is excellent at the time of mounting the multilayer ceramic capacitor on the board.

According to the present exemplary embodiment, the first and second horizontal parts 141c and 142c (that are the upper surfaces of the first and second metal frames 141 and 142) and the external electrodes 131 and 132 of the multilayer ceramic capacitor may be respectively electrically connected by conductive adhesives 151 and 152.

According to the exemplary embodiment, the first and second vertical parts 141a and 142a that are end surfaces of the first and second metal frames 141 and 142 may be disposed to be spaced apart from each of the external electrodes 131 and 132.

Further, the first and second terminal parts 141b and 142b (that are the lower surfaces of the first and second metal frames 141 and 142) may be disposed to be spaced apart from each of the external electrodes 131 and 132.

Therefore, the first and second metal frames 141 and 142 have a structure in which the first and second horizontal parts 141c and 142c (that are the upper surfaces of the metal frames 141 and 142) may be the only portions of the metal frames 141 and 142 that are bonded to the first and second external electrodes 131 and 132 to reduce an area transferring the vibrations of the external electrodes, thereby further reducing acoustic noise.

Further, the first and second metal frames 141 and 142 may absorb mechanical stress due to the deformation of the mounted board by elastic force and reduce the transfer of mechanical stress from the board to the ceramic body 110 so as to prevent the development of defects such as cracks in the ceramic body 110 caused by the mechanical stress, thereby allowing for a reliability improvement effect.

Further, according to the present exemplary embodiment, even in the case that an interval between the first and second terminal parts 141b and 142b and the external electrodes 131 and 132 is set to be minimal, sufficient elastic force may be obtained from the first and second metal frames 141 and 142. Thus, a height of the electronic component can be reduced further than the existing metal frame product in which the interval between the lower terminal part and the lower surface of the multilayer ceramic capacitor is large.

Meanwhile, plating layers (not shown) may be formed on the first and second metal frames 141 and 142.

As an example, the plating layers may include first and second nickel (Ni) plating layers respectively formed on the first and second metal frames 141 and 142 and first and second tin (Sn) plating layers respectively formed on the first and second nickel plating layers.

As another example, the plating layers may include first and second nickel (Ni) plating layers respectively formed on the first and second metal frames 141 and 142 and first and second gold (Au) plating layers respectively formed on the first and second nickel plating layers.

Figure 2A:
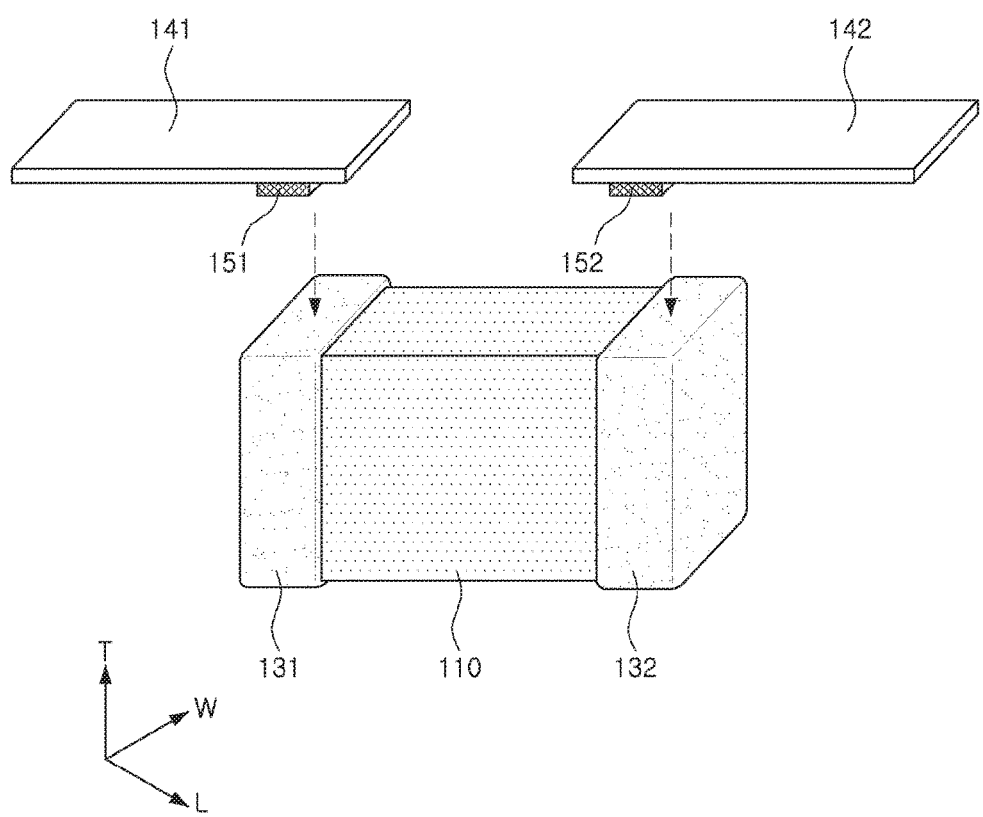
FIGS. 2A through 2C are perspective views showing respective steps of a manufacturing process for manufacturing the multilayer ceramic electronic component of FIG. 1.
Figure 2B:
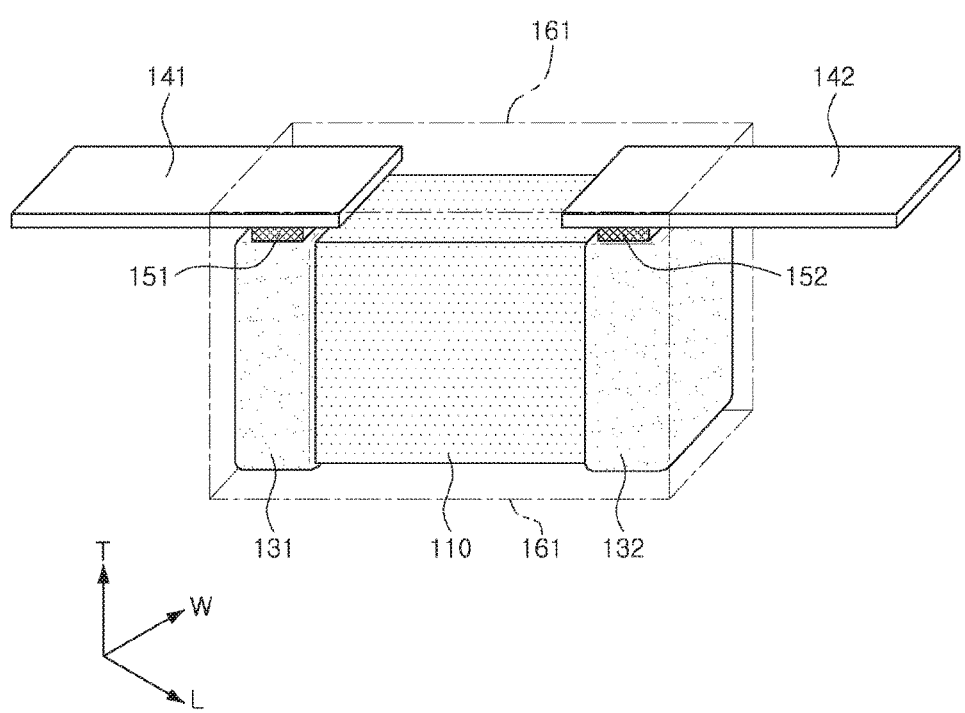
Figure 2C:
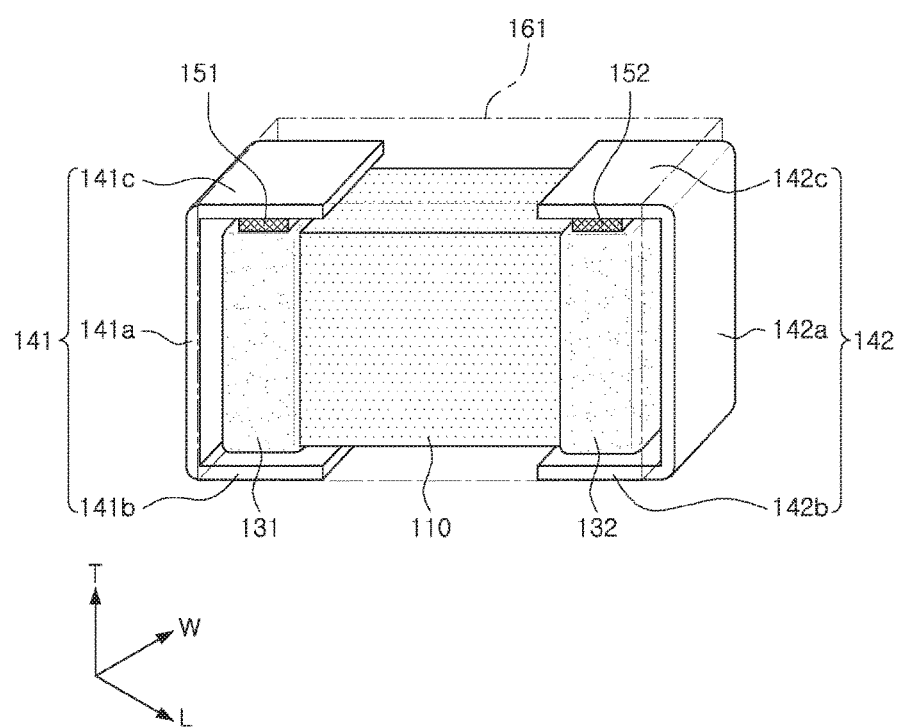

FIGS. 2A through 2C are perspective views showing respective steps of a manufacturing process for manufacturing the multilayer ceramic electronic component of FIG. 1.

Referring to FIG. 2A, the lower surfaces of the first and second metal frames 141 and 142 have conductive adhesives 151 and 152, respectively, applied thereto. The conductive adhesives 151 and 152 are themselves electrically connected to the upper portions of the external electrodes 131 and 132, respectively, of the multilayer ceramic capacitor including the external electrodes 131 and 132 disposed on both end surfaces of the ceramic body 110 in the length direction.

As the conductive adhesives 151 and 152, a conductive resin paste may be used but the conductive adhesives are not limited thereto. For example, soldering in a high temperature state may also be used.

Referring to FIG. 2B, an insulating cover 161 may be formed or disposed to enclose the multilayer ceramic capacitor and portions of the upper surfaces of the first and second metal frames 141 and 142. The insulating cover 161 may be formed by forming an insulating material to cover the multilayer ceramic capacitor having the external electrodes 131 and 132 connected to the first and second metal frames 141 and 142 by the conductive adhesives 151 and 152.

The insulating material may be formed of a thermosetting resin such as an epoxy resin, but is not limited thereto.

Referring to FIG. 2C, the first and second metal frames 141 and 142 may be bent along lines disposed outside of the insulating cover 161 to form the end surfaces 141a and 142a and the lower surfaces 141b and 142b of the first and second metal frames 141 and 142.

As a result of the bending, the first and second metal frames 141 and 142 may have an end surface having a '⊏'-shape.

Figure 3:
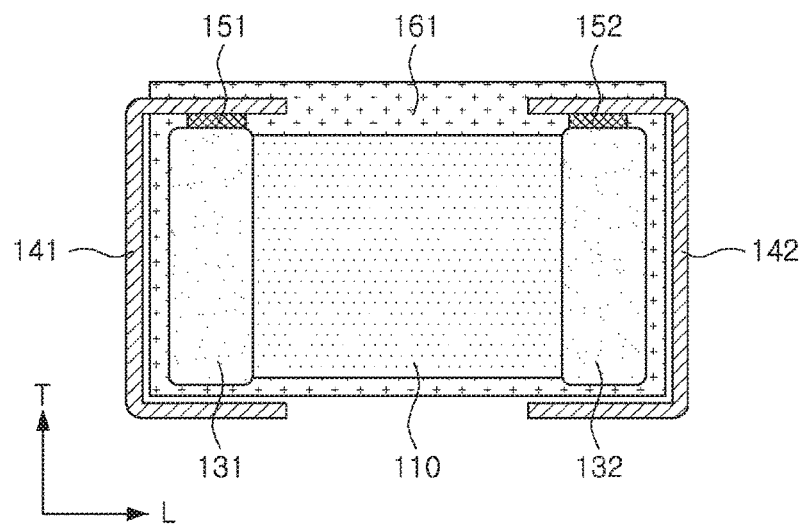
FIG. 3 is a side view showing an inside of the multilayer ceramic electronic component of FIG. 1.

FIG. 3 is aside view showing an inside of the multilayer ceramic electronic component of FIG. 1.

Referring to FIG. 3, the external electrodes 131 and 132 of the multilayer ceramic capacitor may respectively be connected to the first and second metal frames 141 and 142 by the conductive adhesives 151 and 152, and the insulating cover 161 may be disposed to enclose the multilayer ceramic capacitor and the upper surfaces of the first and second metal frames 141 and 142.

The insulating cover 161 may be disposed to enclose the multilayer ceramic capacitor and the first and second horizontal parts 141c and 142c that are the upper surfaces of the first and second metal frames 141 and 142. The first and second terminal parts 141b and 142b and the first and second vertical parts 141a and 142a that are the lower surfaces and the end surfaces of the first and second metal frames 141 and 142 may be exposed externally.

The first and second terminal parts 141b and 142b and the first and second vertical parts 141a and 142a that are the lower surfaces and the end surfaces of the first and second metal frames 141 and 142 may be disposed to be spaced apart from the insulating cover 161 but are not necessarily limited thereto.

According to one exemplary embodiment, the multilayer ceramic capacitor may be wrapped with an insulating resin to form the insulating cover 161 to prevent outer moisture from permeating into the multilayer ceramic capacitor, thereby improving the moisture proofing properties of the multilayer ceramic capacitor.

Figure 4:
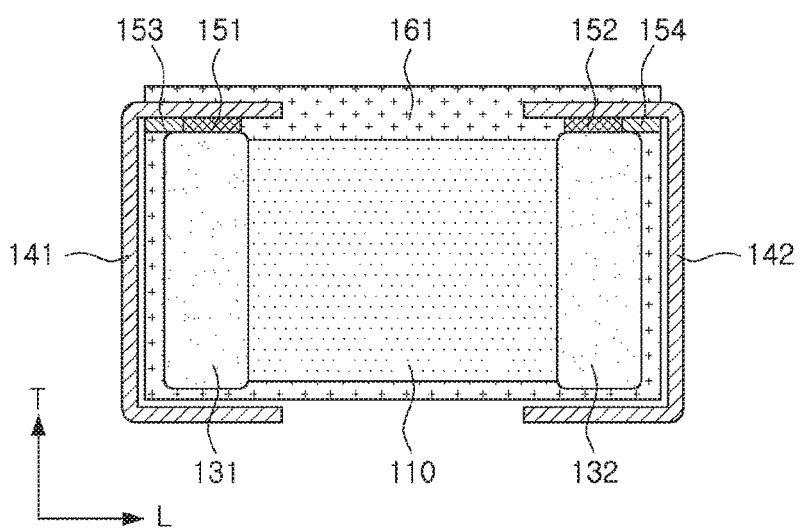
FIG. 4 is a side view showing an inside of a multilayer ceramic electronic component according to another exemplary embodiment.

FIG. 4 is a side view showing an inside of a multilayer ceramic electronic component according to another exemplary embodiment.

Referring to FIG. 4, in the multilayer ceramic electronic component according to another exemplary embodiment, solder resist layers 153 and 154 may be further interposed between the end portion of the insulating cover 161 and the conductive adhesives 151 and 152.

The solder resist layers 153 and 154 may be further inserted, and thus the sealability of the multilayer ceramic electronic component according to another exemplary embodiment may be further improved, thereby improving the moisture proofing properties.

Figure 5:
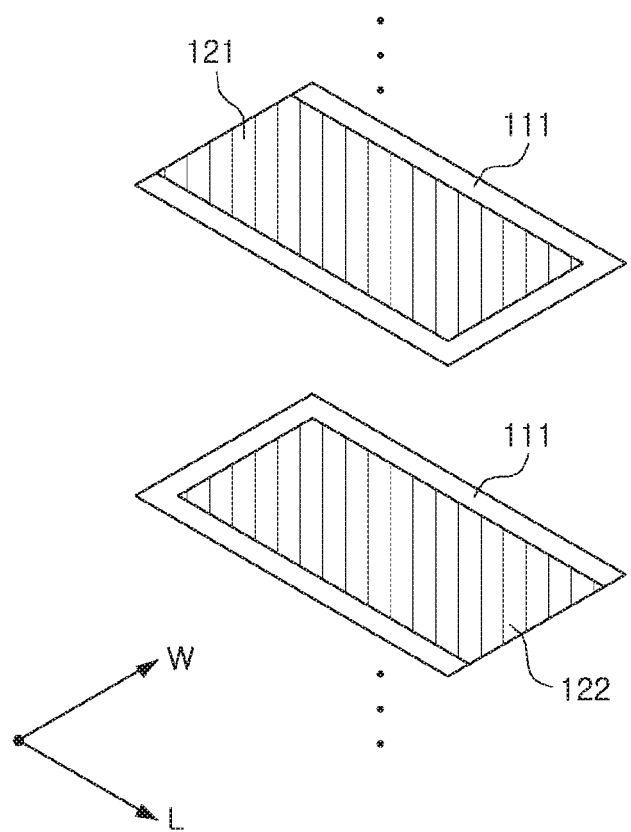
FIG. 5 is a separated view schematically illustrating an example of an internal electrode disposition structure in the multilayer ceramic electronic component according to the exemplary embodiment.

FIG. 5 is a separated view schematically illustrating an example of an internal electrode disposition structure in the multilayer ceramic electronic component according to the exemplary embodiment.

A thickness of one dielectric layer 111 may be arbitrarily changed depending on a capacitance design of the multilayer ceramic capacitor. In addition, the dielectric layer 111 may contain a high-k ceramic material, for example, a barium titanate ($BaTiO_3$)-based ceramic powder, or the like. However, a material of the dielectric layer 111 is not limited thereto.

An example of the barium titanate ($BaTiO_3$)-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, in which Ca, Zr, or the like, is partially dissolved in $BaTiO_3$. However, an example of the barium titanate ($BaTiO_3$)-based ceramic powder is not limited thereto.

Meanwhile, the dielectric layer 111 may further contain a ceramic additive, an organic solvent, a plasticizer, a binder, a dispersant, or the like, in addition to the ceramic powder.

As the ceramic additive, for example, at least one of a transition metal oxide, carbide, a rare earth element, magnesium (Mg), aluminum (Al), or the like may be used.

As illustrated in FIG. 5, first and second internal electrodes 121 and 122 may alternately be formed on adjacent ceramic sheets forming the dielectric layers 111, stacked in the thickness direction, and then sintered, such that the first and second internal electrodes 121 and 122 are alternately disposed in the ceramic body 110 with each of the dielectric layers 111 interposed therebetween.

The first and second internal electrodes 121 and 122, which have different polarities, may be disposed to face each other in a direction in which the dielectric layers 111 are stacked and may be electrically insulated from each other by the dielectric layers 111 disposed therebetween.

One end portion of each first internal electrode 121 may be exposed through one end surface of the ceramic body 110, and one end portion of each second internal electrode 122 may be exposed through another end surface of the ceramic body 110 opposite to the one end surface in a length direction.

The end portions of the first and second internal electrodes 121 and 122 alternately exposed through both end surfaces of the ceramic body 110 in a length direction, as described above, may respectively be electrically connected to the external electrodes 131 and 132 disposed on both end surfaces of the ceramic body 110 in the length direction.

Hereinafter, the external electrodes 131 and 132 may be separately termed the first external electrode 131 and the second external electrode 132.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated on the first and second internal electrodes 121 and 122 facing each other.

Here, a capacitance of the multilayer ceramic capacitor may be proportional to an area of a region in which the first and second internal electrodes 121 and 122 are overlapped with each other in the direction in which the dielectric layers 111 are stacked.

Meanwhile, the present exemplary embodiment shows a horizontal stack type multilayer ceramic capacitor in which the first and second internal electrodes 121 and 122 are stacked in the thickness direction of the ceramic body 110 that is parallel to the mounting surface, but the multilayer ceramic capacitor according to an exemplary embodiment is not limited thereto.

The first and second external electrodes 131 and 132 may be formed by sintering conductive pastes for forming external electrodes containing copper (Cu) in order to have excellent electrical properties and provide high reliability such as excellent heat cycle resistance, moisture resistance, and the like. However, the first and second external electrodes 131 and 132 are not limited to being formed as described above.

Meanwhile, plating layers (not illustrated) may be formed on the first and second external electrodes 131 and 132.

The plating layers may include first and second nickel (Ni) plating layers respectively formed on the first and second external electrodes 131 and 132 and first and second tin (Sn) plating layers respectively formed on the first and second nickel plating layers, as an example.

Figure 6:
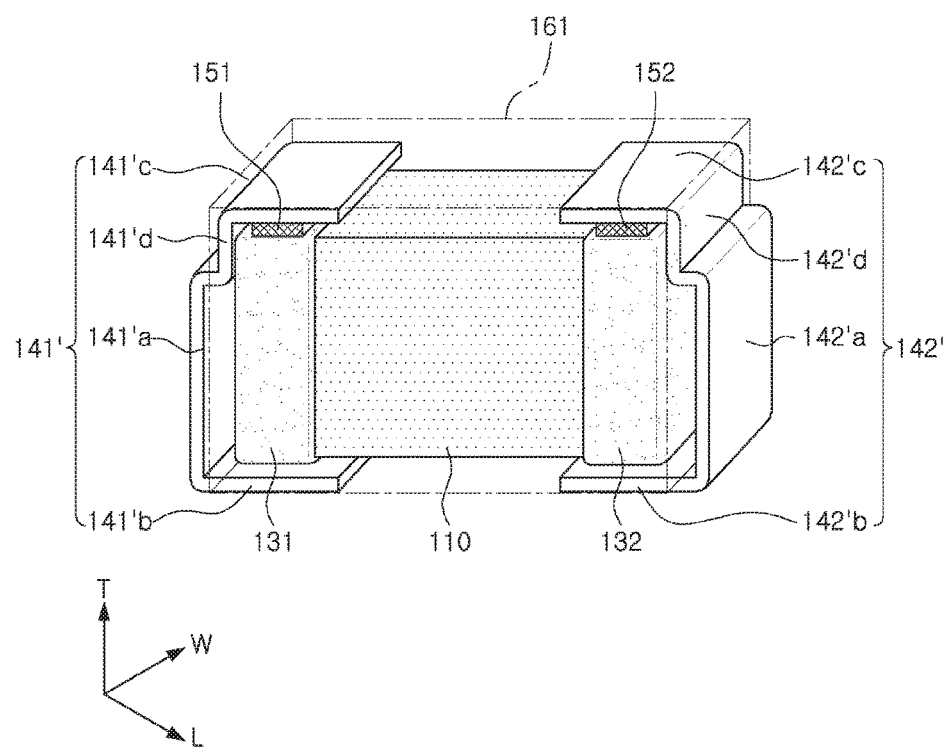
FIG. 6 is a perspective view schematically illustrating a multilayer ceramic electronic component according to another exemplary embodiment.

FIG. 6 is a perspective view schematically illustrating a multilayer ceramic electronic component according to another exemplary embodiment.

Figure 7A:
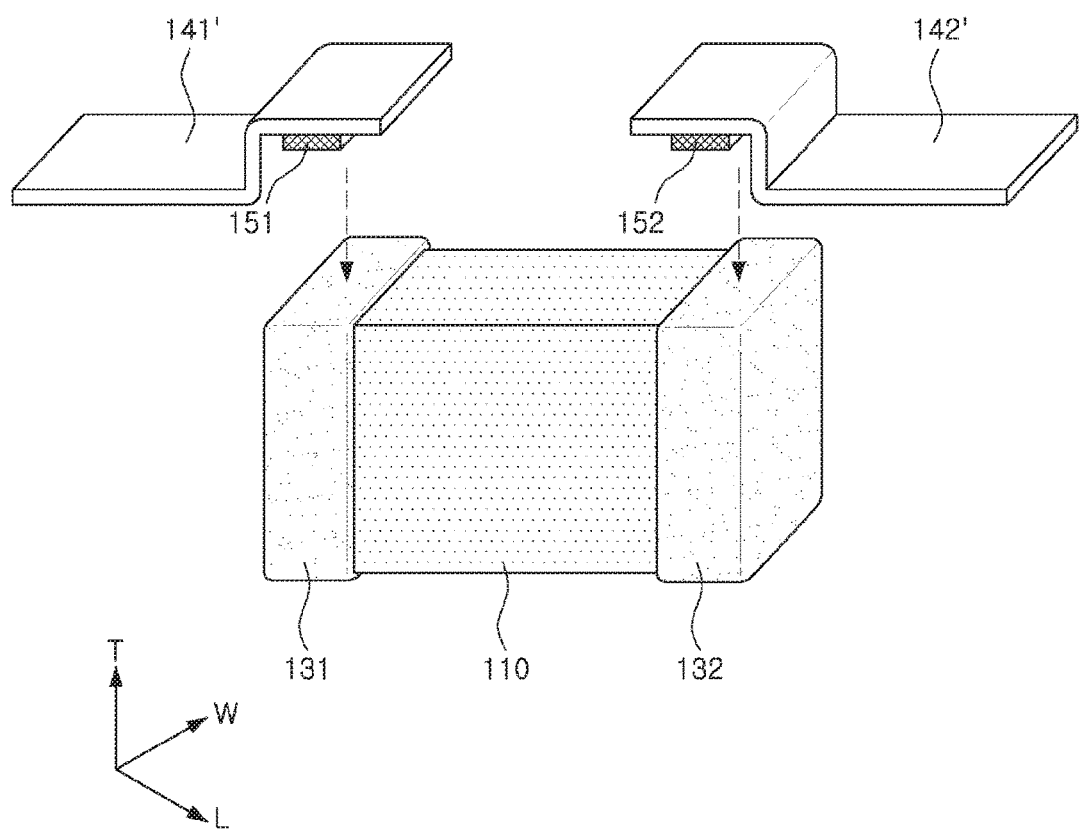
FIGS. 7A through 7C are perspective views showing steps of a manufacturing process for manufacturing the multilayer ceramic electronic component of FIG. 6.
Figure 7B:
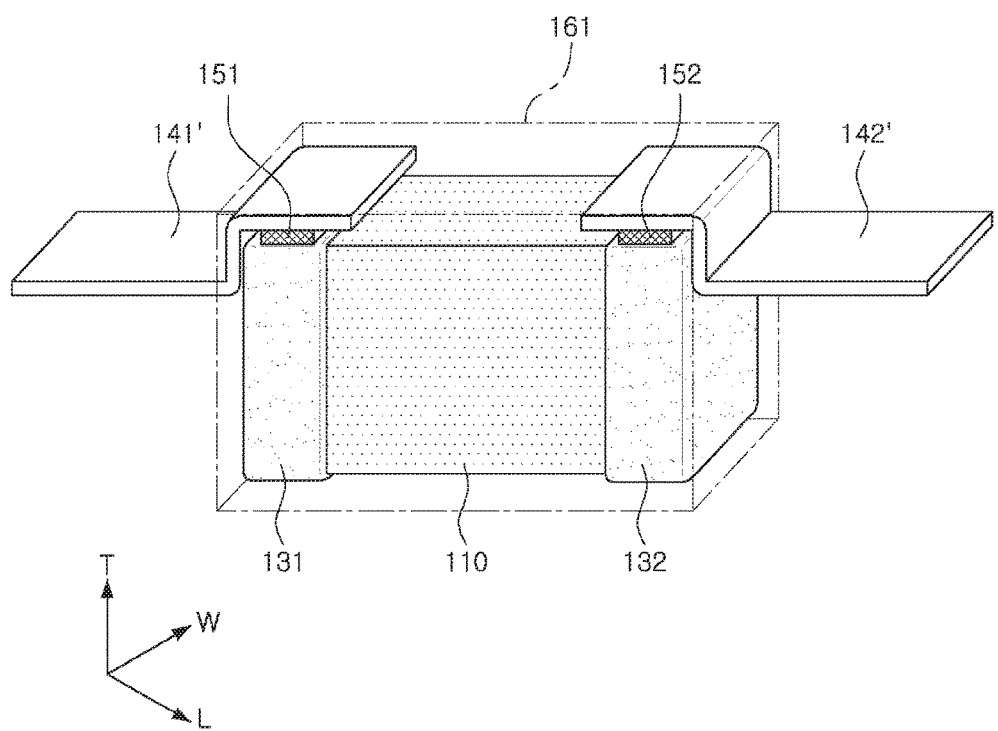
Figure 7C:
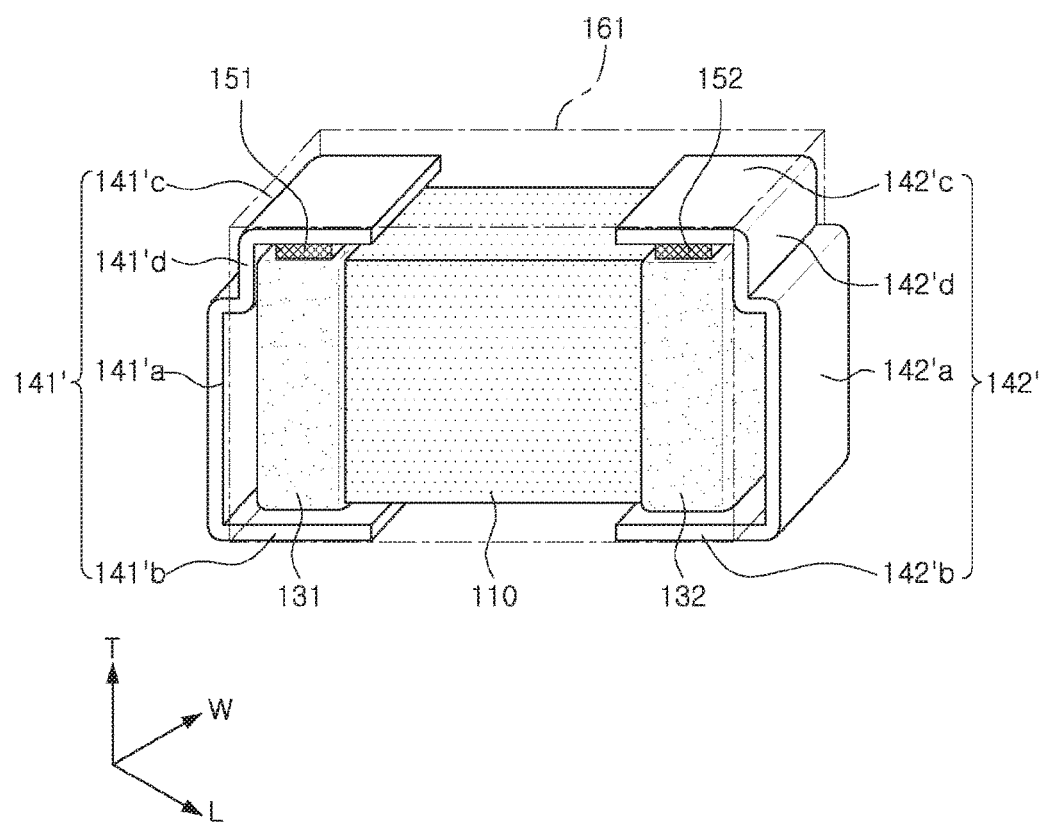

FIGS. 7A through 7C are perspective views showing steps of a manufacturing process for manufacturing the multilayer ceramic electronic component of FIG. 6.

Figure 8:
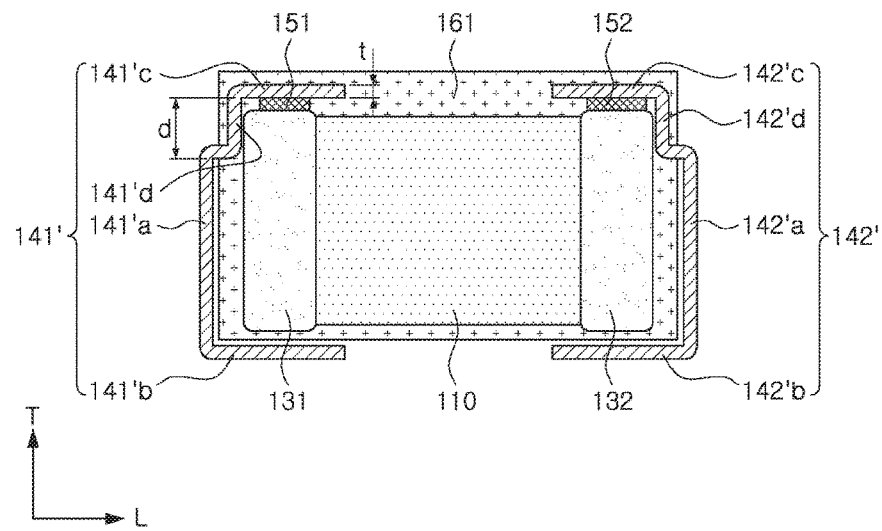
FIG. 8 is a side view showing an inside of the multilayer ceramic electronic component of FIG. 6.

FIG. 8 is aside view showing an inside of the multilayer ceramic electronic component of FIG. 6.

Referring to FIGS. 6, 7A-7C, and 8, the multilayer ceramic electronic component according to the other exemplary embodiment has differently shaped first and second metal frames as compared to the multilayer ceramic electronic component shown in FIG. 1.

Therefore, the shape of the first and second metal frame will be mainly described below.

According to another exemplary embodiment, a step portion may be further formed between upper surfaces and end surfaces of first and second metal frames 141' and 142'.

That is, the first and second metal frames 141' and 142' may include first and second terminal parts 141'b and 142'b disposed on the mounting surface of the ceramic body 110 and serving as a terminal for mounting on the board. The first and second metal frames 141' and 142' may further include first and second horizontal parts 141'c and 142'c disposed to face the first and second terminal parts 141'b and 142'b upwardly and downwardly, having the ceramic body 110 disposed therebetween, and connected to the external electrodes 131 and 132, respectively, on the other surface of the mounting surface of the ceramic body 110. The first and second metal frames 141' and 142' may additionally include first and second vertical parts 141'a and 142'a connecting the first and second horizontal parts 141'c and 142'c to the first and second terminal parts 141'b and 142'b, respectively.

Further, step portions 141'd and 142'd may be further formed between the first and second horizontal parts 141'c and 142'c that are upper surfaces of the first and second metal frames 141' and 142' and the first and second vertical parts 141'a and 142'a that are the end surfaces thereof.

The description of the process of manufacturing the multilayer ceramic electronic component provided with reference to FIGS. 7A through 7C is substantially similar to that described in FIGS. 2A through 2C, except that step portions 141'd and 142'd may be further formed between the first and second horizontal parts 141'c and 142'c that are upper surfaces of the first and second metal frames 141' and 142' and the first and second vertical parts 141'a and 142'a that are the end surfaces thereof, and therefore the detailed description thereof will be omitted.

Referring to FIG. 8, a ratio d/t of a dimension d of the step portions 141'd and 142'd to a thickness t of the first and second metal frames 141' and 142' may meet d/t≥2.

The ratio d/t of the dimension d of the step portions 141'd and 142'd in the stacking direction to the thickness t of the first and second metal frames 141' and 142' may be controlled to meet d/t≥2, thereby improving the mechanical strength of the multilayer ceramic electronic component.

That is, in the case of the multilayer ceramic electronic component meeting the numerical range on the bending test, it may be appreciated that the occurrence rate of cracks is reduced and thus reliability is excellent.

The following Table 1 shows unexpected results obtained from a comparison of the occurrence rate of cracks on the bending test depending on the ratio d/t of the distance d of the step portions 141'd and 142'd to the thickness t of the first and second metal frames 141' and 142'.

The test was performed on multilayer ceramic electronic components having two different sizes, and was performed by setting a bending amount to be 5 mm.

The multilayer ceramic electronic components used in the tests were products having a 2012 size (length×width×thickness, 2.0 mm×1.2 mm×1.2 mm) and a 1068 size (length×width×thickness, 1.6 mm×0.8 mm×0.8 mm) that were subjected to the test.

TABLE 1

| Size of multilayer ceramic electronic component | t (mm) | d (mm) | Crack Occurrence Rate |
|---|---|---|---|
| 2012 | 0.1 | 0 | 2/20 |
|  | 0.1 | 0.1 | 1/20 |
|  | 0.1 | 0.2 | 0/20 |
|  | 0.1 | 0.25 | 0/20 |
| 1608 | 0.06 | 0 | 1/20 |
|  | 0.06 | 0.08 | 1/20 |
|  | 0.06 | 0.12 | 0/20 |
|  | 0.06 | 0.18 | 0/20 |

Referring to the above Table 1, when the ratio d/t of the distance d of the step portions 141'd and 142'd to the thickness t of the first and second metal frames 141' and 142' meets d/t≥2, it may be appreciated that the occurrence ratio of cracks is very low and thus reliability is excellent.

On the other hand, when the ratio d/t of the distance d of the step portions 141'd and 142'd to the thickness t of the first and second metal frames 141' and 142' does not meet d/t≥2, it may be appreciated that the occurrence ratio of cracks is very high and thus reliability may be reduced.

Figure 9:
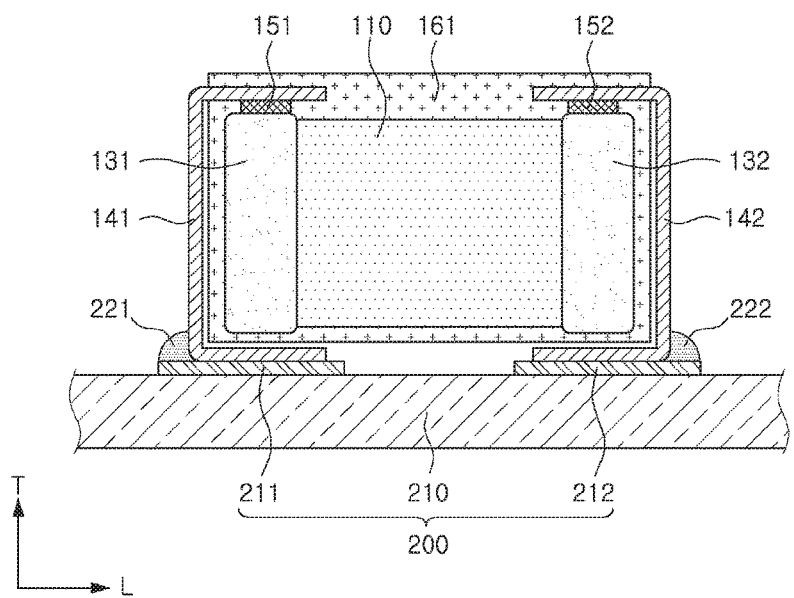
FIG. 9 is a side view showing a board assembly having mounted thereon a multilayer ceramic electronic component according to an exemplary embodiment.

FIG. 9 is a side view illustrating a board assembly 200 having mounted thereon a multilayer ceramic capacitor according to an exemplary embodiment.

Referring to FIG. 9, the board assembly 200 having a multilayer ceramic electronic component according to the exemplary embodiment may include a board 210 on which the multilayer ceramic electronic component is mounted and first and second electrode pads 211 and 212 formed on an upper surface of the board 210 to be spaced apart from each other in the length direction.

In this case, the first and second terminal parts 141b and 142b, which correspond to portions of the first and second metal frames 141 and 142 that are disposed on the lower surface of the ceramic body 110, are respectively connected on the first and second electrode pads 211 and 212 on the board, and the multilayer ceramic electronic components may be bonded by solders 221 and 222 to be electrically connected to each other.

As described above, when voltages having different polarities are applied to the first and second external electrodes 131 and 132 of the multilayer ceramic capacitor through the first and second metal frames 141 and 142 in the state in which the multilayer electronic component is mounted on the board 210, the ceramic body 110 may be expanded and contracted in the thickness direction due to an inverse piezoelectric effect of the dielectric layer, and both end portions of the first and second external electrodes 131 and 132 may be contracted and expanded as opposed to the expansion and the contraction of the ceramic body 110 in the thickness direction due to the Poisson effect.

The above-mentioned expansion and contraction of the ceramic body 110 may generate vibrations which may be transferred to the board 210 through the external electrodes to radiate sound from the board 210, experienced as acoustic noise.

According to the present exemplary embodiment, the piezoelectric vibrations transferred to the board through the first and second external electrodes 131 and 132 of the multilayer ceramic capacitor may be absorbed or attenuated by the elasticity of the first and second metal frames 141 and 142, and mechanical stress generated due to warpage of the board 210, or the like may also be absorbed by the first and second metal frames 141 and 142, thereby reducing the acoustic noise of the product.

Further, since the metal frame absorbs the mechanical stress, the stress may not be transferred to the multilayer ceramic capacitor, thereby preventing damage such as cracks.

Further, the multilayer ceramic capacitor may be covered with the insulating resin, thereby improving the moisture proofing properties.

As set forth above, according to one exemplary embodiment described in the present disclosure, since the metal frame absorbs the mechanical stress, the stress may not be transferred to the multilayer ceramic capacitor, thereby preventing occurrence of damage such as cracks.

Further, the multilayer ceramic capacitor may be covered with the insulating resin, thereby improving the moisture proofing properties.

Further, the elastic force of the metal frame may absorb the vibration transferred through the external electrode of the ceramic body, thereby reducing the acoustic noise.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component, comprising:
    a multilayer ceramic capacitor including a ceramic body having a plurality of dielectric layers stacked together and first and second internal electrodes alternately disposed between pairs of adjacent dielectric layers of the plurality of stacked dielectric layers, and external electrodes disposed on two end surfaces of the ceramic body opposite each other in a length direction orthogonal to a stacking direction of the dielectric layers;
    first and second metal frames each disposed along a respective one of two end surfaces of the multilayer ceramic capacitor opposite each other in the length direction and each disposed along upper and lower surfaces of the multilayer ceramic capacitor; and
    an insulating cover disposed on and in direct contact with all outer surfaces of the multilayer ceramic capacitor and upper surfaces of the first and second metal frames,
    wherein first and second vertical portions respectively of the first and second metal frames disposed along the two end surfaces of the multilayer ceramic capacitor and first and second further portions respectively of the first and second metal frames disposed along the lower surfaces of the multilayer ceramic capacitor are exposed externally from the insulating cover, and
    the insulating cover is disposed between the first vertical portion and a respective one of the external electrodes in direct contact therewith, and between the second vertical portion and another respective one of the external electrodes in direct contact therewith.

2. The multilayer ceramic electronic component of claim 1, wherein the first and second metal frames include first and second terminal parts, respectively, each disposed along a mounting surface of the ceramic body,
    wherein the insulating cover is disposed between the first terminal part and the respective one of the external electrodes in direct contact therewith and between the second terminal part and the other respective one of the external electrodes in direct contact therewith.

3. The multilayer ceramic electronic component of claim 1, wherein an upper portion of each of the first and second metal frames is connected by a conductive adhesive to a respective one of the external electrodes of the multilayer ceramic capacitor.

4. The multilayer ceramic electronic component of claim 3, wherein a solder resist layer is interposed between an end portion of the insulating cover and the conductive adhesive.

5. The multilayer ceramic electronic component of claim 1, wherein portions of the first and second metal frames that are disposed along end surfaces and lower surfaces of the multilayer ceramic capacitor are spaced apart from the external electrodes of the multilayer ceramic capacitor.

6. The multilayer ceramic electronic component of claim 1, wherein portions of the first and second metal frames disposed along end surfaces and lower surfaces of the multilayer ceramic capacitor are bent along the insulating cover.

7. The multilayer ceramic electronic component of claim 1, wherein each of the first and second metal frames includes a step portion disposed between portions of the metal frame disposed along the upper surface and along the respective one end surface of the multilayer ceramic capacitor.

8. The multilayer ceramic electronic component of claim 7, wherein $d/t \geq 2$, in which a ratio $d/t$ is a ratio of a dimension $d$ of the step portion to a thickness $t$ of the first and second metal frames.

9. A board assembly having a multilayer ceramic electronic component, comprising:
    a board having first and second electrode pads mounted thereon; and
    the multilayer ceramic electronic component of claim 1 mounted on the first and second electrode pads,
    wherein the first and second metal frames are respectively connected to the first and second electrode pads.

10. The board assembly of claim 9, wherein an upper portion of each of the first and second metal frames is connected by a conductive adhesive to a respective one of the external electrodes of the multilayer ceramic capacitor.

11. The board assembly of claim 10, wherein a solder resist layer is interposed between an end portion of the insulating cover and the conductive adhesive.

12. The board assembly of claim 9, wherein portions of the first and second metal frames that are disposed along end surfaces and lower surfaces of the multilayer ceramic capacitor are spaced apart from the external electrodes of the multilayer ceramic capacitor.

13. The board assembly of claim 9, wherein each of the first and second metal frames includes a step portion disposed between portions of the metal frame disposed along the upper surface and along the respective one end surface of the multilayer ceramic capacitor.

14. The board assembly of claim 13, wherein $d/t \geq 2$, in which a ratio $d/t$ is a ratio of a dimension $d$ of the step portion to a thickness $t$ of the first and second metal frames.

15. A multilayer ceramic electronic component comprising:
    a multilayer ceramic capacitor having a hexahedral shape, and having a pair of external electrodes spaced apart from each other on an upper surface of the multilayer ceramic capacitor;
    first and second metal frames each including an upper portion, a lower portion, and a connection portion, and each such that the upper portion is disposed along the upper surface of the multilayer ceramic capacitor, the lower portion is disposed along a lower surface of the multilayer ceramic capacitor, and the connection portion extends between the upper and lower portions along an entirety of the respective end surface of the multilayer ceramic capacitor;

an insulating cover disposed on and in direct contact with all outer surfaces of the multilayer ceramic capacitor and upper surfaces of the first and second metal frames, an insulating layer formed of an insulating material and disposed between each respective external electrode, of the pair of external electrodes, that is in direct contact with the insulating layer and the connection portion of the respective metal frame of the first and second metal frames, wherein the upper portion of each of the first and second metal frames is the only portion of the first and second metal frames that is adhesively connected to a respective external electrode of the multilayer ceramic capacitor;

wherein first and second vertical portions respectively of the first and second metal frames disposed along the two end surfaces of the multilayer ceramic capacitor and first and second further portions respectively of the first and second metal frames disposed along the lower surfaces of the multilayer ceramic capacitor are exposed externally from the insulating cover, and the insulating cover is disposed between the first vertical portion and a respective one of the external electrodes in direct contact therewith, and between the second vertical portion and another respective one of the external electrodes in direct contact therewith.

16. The multilayer ceramic electronic component of claim 15, wherein the lower portion and the connection portion of each of the first and second metal frames are spaced apart from the multilayer ceramic capacitor.

17. The multilayer ceramic electronic component of claim 15, wherein the connection portion of each of the first and second metal frames includes a step portion, and the insulating cover surrounds the step portions of the first and second metal frames.

18. The multilayer ceramic electronic component of claim 15, wherein the external electrodes of the multilayer ceramic capacitor each extend from the upper surface to a respective side surface and the lower surface of the multilayer ceramic capacitor.

19. A board assembly comprising:
a board having first and second electrode pads thereon; and
the multilayer ceramic electronic component of claim 15 mounted on the first and second electrode pads,
wherein the lower portion of each of the first and second metal frames is mounted on a respective one of the first and second electrode pads.

* * * * *